United States Patent
Nam et al.

(10) Patent No.: US 9,783,026 B2
(45) Date of Patent: Oct. 10, 2017

(54) COOLING AND THERMOELECTRIC POWER GENERATING SYSTEM FOR VEHICLE

(71) Applicant: Hyundai Motor Company, Seoul (KR)

(72) Inventors: Jongwoo Nam, Seoul (KR); Hanshin Chung, Yongin-si (KR); Joonho Lee, Seoul (KR); Hyun Cho, Seoul (KR)

(73) Assignee: Hyundai Motor Company, Seoul (KR)

( * ) Notice: Subject to any disclaimer, the term of this patent is extended or adjusted under 35 U.S.C. 154(b) by 307 days.

(21) Appl. No.: 14/559,698

(22) Filed: Dec. 3, 2014

(65) Prior Publication Data

US 2016/0347152 A1 Dec. 1, 2016

(30) Foreign Application Priority Data

May 8, 2014 (KR) .................. 10-2014-0055061

(51) Int. Cl.
*H01L 35/30* (2006.01)
*B60H 1/32* (2006.01)

(52) U.S. Cl.
CPC ........... *B60H 1/3227* (2013.01); *B60H 1/323* (2013.01); *H01L 35/30* (2013.01); *Y02T 10/166* (2013.01)

(58) Field of Classification Search
CPC ....... H01L 35/30; B60H 1/3229; B60H 1/323; B60H 1/3232; Y02T 10/166
USPC ........ 136/200–242; 123/41.19, 41.21, 41.25; 62/133, 134, 159
See application file for complete search history.

(56) References Cited

U.S. PATENT DOCUMENTS

| 2,807,201 A * | 9/1957 | Leslie ...................... B60H 1/28 454/147 |
| 5,408,843 A * | 4/1995 | Lukas .................. B60H 1/3227 62/244 |
| 2004/0106027 A1* | 6/2004 | Imaseki ............ H01M 8/04029 429/435 |

(Continued)

FOREIGN PATENT DOCUMENTS

| JP | 2006-306226 A | 11/2006 |
| JP | 4083545 B2 | 4/2008 |
| JP | 5240444 B2 | 7/2013 |

(Continued)

OTHER PUBLICATIONS

JP 2006-306226 Machine Translation, 2006, pp. 1-16.*

*Primary Examiner* — Thanh-Truc Trinh
(74) *Attorney, Agent, or Firm* — Morgan, Lewis & Bockius LLP

(57) ABSTRACT

A cooling and thermoelectric power generating system for a vehicle may include a low temperature radiator disposed at an ambient air intake which is configured to allow ambient air in front of the vehicle to be introduced to an engine room, a coolant line adapted that coolant passing through the low temperature radiator is circulated again through the low temperature radiator via a water-cooled condenser, a refrigerant line adapted that refrigerant is flowed through the condenser, and a thermoelectric generator adapted that coolant flowing through the coolant line and refrigerant flowing through the refrigerant line are passed therethrough, in which the thermoelectric generator performs thermoelectric generation by using temperature difference between coolant flowing through the coolant line and refrigerant flowing through the refrigerant line.

7 Claims, 2 Drawing Sheets

(56) References Cited

U.S. PATENT DOCUMENTS

2005/0247336 A1* 11/2005 Inaoka .................. B60H 1/004
                                                        136/205

FOREIGN PATENT DOCUMENTS

| KR | 10-2011-0061216   | 6/2011  |
| KR | 10-2012-0126988   | 11/2012 |
| KR | 10-2012-0127761   | 11/2012 |
| KR | 10-2013-0021743 A | 3/2013  |
| KR | 10-2013-0065176   | 6/2013  |

* cited by examiner

COOLING AND THERMOELECTRIC POWER GENERATING SYSTEM FOR VEHICLE

CROSS-REFERENCE TO RELATED APPLICATION

The present application claims priority to Korean Patent Application No. 10-2014-0055061 filed May 8, 2014, the entire contents of which is incorporated herein for all purposes by this reference.

BACKGROUND OF THE INVENTION

Field of the Invention

The present invention relates to a cooling and thermoelectric power generating system for a vehicle. More particularly, the present invention relates to cooling and thermoelectric power generating system for vehicle which improves cooling performance of a vehicle and performs generation by using waste heat.

Description of the Related Art

Generally, the thermoelectric generation is to perform generation by using phenomenon that current flows if temperatures of both contacts are different with each other in a closed circuit comprising different two kinds of metals.

There is the thermoelectric generation system by using exhaust heat as a type applying the thermoelectric generation to a vehicle. This type is a type generating electric power by that a thermoelectric element is mounted on a pipe through which exhaust gas is exhausted, exhaust gas having a high temperature is passed through inside of a thermoelectric module such that a high temperature portion is formed, and a coolant cooled by an additional device is supplied to outside of the thermoelectric module such that a low temperature portion is formed.

However, the system may be complex, package composition may be disadvantageous, and material cost and vehicle weight may be increased because an additional cooling apparatus (an ancillary radiator, a fan, a water pump and so on) for supplying coolant to the low temperature portion is required.

In addition, drawback such as engine output power deterioration may be occurred as the thermoelectric system which is mounted at a middle part of an exhaust pipe disturbs exhaust flow of exhaust gas.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a cooling and thermoelectric power generating system for a vehicle having advantages of improving cooling performance of a vehicle and generating electric power required for a vehicle by using waste heat of a cooling system.

According to various aspects of the present invention, a cooling and thermoelectric power generating system for a vehicle may include a low temperature radiator disposed at an ambient air intake which is configured to allow ambient air in front of the vehicle to be introduced to an engine room, a coolant line adapted that coolant passing through the low temperature radiator is circulated again through the low temperature radiator via a water-cooled condenser, a refrigerant line adapted that refrigerant is flowed through the condenser, and a thermoelectric generator adapted that coolant flowing through the coolant line and refrigerant flowing through the refrigerant line are passed therethrough, in which the thermoelectric generator may perform thermoelectric generation by using temperature difference between coolant flowing through the coolant line and refrigerant flowing through the refrigerant line.

The system may further include at least a pair of side ducts symmetrically formed to guide ambient air in front of the vehicle toward a wheel of the vehicle, in which an ancillary low temperature radiator may be disposed at the each side duct for selectively cooling coolant passing through the low temperature radiator.

The coolant line may include a first coolant line adapted that coolant passing through the low temperature radiator is flowed to the condenser, a second coolant line adapted to transmit coolant exhausted from the condenser to the thermoelectric generator, a third coolant line adapted to transmit coolant passing through the thermoelectric generator to the low temperature radiator, a fourth coolant line branched from the first coolant line so as to be connected with one of the ancillary low temperature radiators and connected again with the first coolant line, and a fifth coolant line branched from the third coolant line so as to be connected with the other one of the ancillary low temperature radiators and connected again with the third coolant line.

A first control valve may be disposed at a portion that the first coolant line and the fourth coolant line are branched to each other for controlling such that coolant flowing through the first coolant line is selectively flowed through the fourth coolant line, and a second control valve may be disposed at a portion that the third coolant line and the fifth coolant line are branched to each other for controlling such that coolant flowing through the third coolant line is selectively flowed through the fifth coolant line.

A turbocharger may be provided to the engine and a water-cooled intercooler may be disposed at the second coolant line to cool air passing through the turbocharger such that coolant passing through the condenser cools the intercooler.

The side duct may include a front duct bent by a curved line such that air flowed into the vehicle is guided toward inside in a width direction of the vehicle, and a rear duct bent toward outside in a width direction of the vehicle by a curved line such that air passed through the front duct flows toward a wheel of the vehicle.

A guide airfoil may be disposed at the rear duct so as to guide air toward a wheel of the vehicle direction.

A pump may be disposed on the coolant line.

A one-way valve is provided to the coolant line for preventing backflow of coolant.

The front duct and the rear duct may be bent with an "S" shape such that air flowing via the ancillary low temperature radiators is not partially flowed.

It is understood that the term "vehicle" or "vehicular" or other similar terms as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuel derived from resources other than petroleum). As referred to herein, a hybrid vehicle is a vehicle that has two or more sources of power, for example, both gasoline-powered and electric-powered vehicles.

The methods and apparatuses of the present invention have other features and advantages which will be apparent from or are set forth in more detail in the accompanying drawings, which are incorporated herein, and the following Detailed Description, which together serve to explain certain principles of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

DETAILED DESCRIPTION

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

Figure 1:
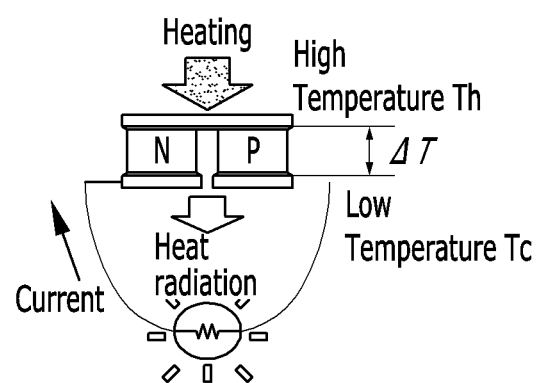
FIG. 1 is a drawing for describing composition of a thermoelectric generating system in the related art.

FIG. 1 is a drawing for describing composition of a thermoelectric generating system in the related art.

Referring to FIG. 1, the thermoelectric generation is that generation is performed by using phenomenon that current is flowed by temperature difference between different two kinds of metals. The thermoelectric generation is well-known to a person of an ordinary skill in the art, so a detailed description thereof will be omitted.

Figure 2:
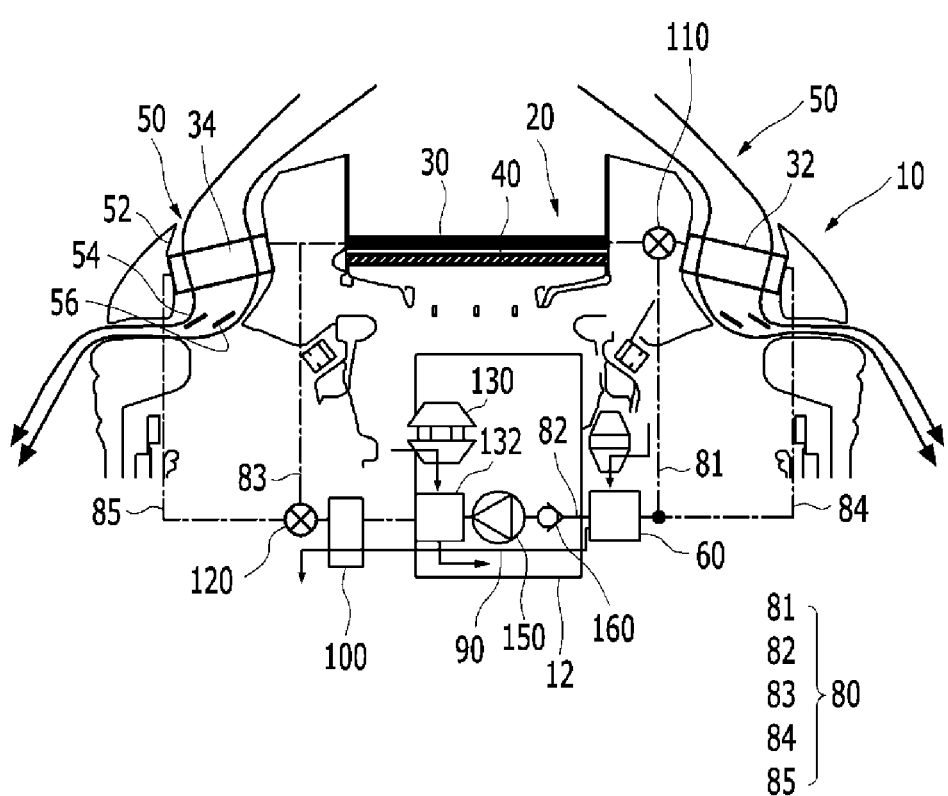
FIG. 2 illustrates an exemplary cooling and thermoelectric power generating system for a vehicle according to the present invention.

FIG. 2 illustrates a cooling and thermoelectric power generating system for a vehicle according to various embodiments of the present invention.

Referring to FIG. 2, a cooling and thermoelectric power generating system for a vehicle according to various embodiments of the present invention includes a low temperature radiator 30 disposed at an ambient air intake 20 which is configured to allow ambient air in front of a vehicle 10 to be introduced to an engine room, a high temperature radiator 40 disposed at rear of the low temperature radiator 30, a coolant line 80 disposed such that coolant passing through the low temperature radiator 30 is circulated again through the low temperature radiator 30 via water-cooled condenser 60, a refrigerant line 90 disposed such that refrigerant is flowed through the condenser 60, and a thermoelectric generator 100 performing the thermoelectric generation by using the coolant passing through the low temperature radiator 30 and the refrigerant flowing through the refrigerant line 90.

An entire system is to be simple by that additional components for supplying heat or for exhausting heat are not required and high efficiency of thermoelectric generation is anticipated by temperature difference between the coolant and the refrigerant as the thermoelectric generator 100 performs the thermoelectric generation by using the coolant passing through the low temperature radiator 30 and the refrigerant flowing through the refrigerant line 90.

The cooling and thermoelectric power generating system for vehicle further includes at least a pair of side duct 50 which is formed to be symmetrical to guide ambient air in front of the vehicle toward a wheel of the vehicle, and an ancillary low temperature radiator 32 and 34 is disposed at the each side duct 50 for selectively cooling coolant passing through the low temperature radiator 30. FIG. 2 shows a pair of side ducts 50 and two ancillary low temperature radiators 32 and 34 which are respectively disposed the pair of side duct 50. In various embodiments of the present invention, one of the two ancillary low temperature radiators 32 and 34 will be called "first ancillary radiator 32" and the other one of the two ancillary low temperature radiators 32 and 34 will be called "second ancillary radiator 34".

The coolant line 80 includes a first coolant line 81 adapted that coolant passing through the low temperature radiator 30 is flowed to the condenser 60, a second coolant line 82 adapted to transmit coolant exhausted from the condenser 60 to the thermoelectric generator 100, a third coolant line 83 adapted to transmit coolant passing through the thermoelectric generator 100 to the low temperature radiator 30, a fourth coolant line 84 branched from the first coolant line 81 so as to be connected with the first ancillary radiator 32 and connected again with the first coolant line 81, and a fifth coolant line 85 branched from the third coolant line 83 so as to be connected with the second ancillary radiator 34 and connected again with the third coolant line 83.

A first control valve 110 is disposed at the portion that the first coolant line 81 and the fourth coolant line 84 are branched to each other for controlling that coolant flowing through the first coolant line 81 is selectively flowed through the fourth coolant line 84.

The first control valve 110 may be mechanical thermostats which are adapted that volume of wax constituent which is filled inside thereof is expanded or contracted according to temperature of coolant which is transmitted thereto or may be electrical thermostats which are operated according to control of a controller (not shown). In addition, the first control valve 110 may be operated for improving cooling efficiency such that a part of coolant flowing the first coolant line 81 is flowed through the fourth coolant line 84 in case that coolant flowing through the coolant line 80 requires additional cooling to except cooling by the low temperature radiator 30.

A second control valve 120 is disposed at the portion that the third coolant line 83 and the fifth coolant line 85 are branched to each other for controlling that coolant flowing through the third coolant line 83 is selectively flowed through the fifth coolant line 85.

The second control valve 120 may be mechanical thermostats which are adapted that volume of wax constituent which is filled inside thereof is expanded or contracted according to temperature of coolant which is transmitted thereto or may be electrical thermostats which are operated according to control of a controller. In addition, the second control valve 120 may be operated that a part of coolant flowing the third coolant line 83 is flowed through the fifth coolant line 85 so as to improve cooling efficiency in case that coolant flowing through the coolant line 80 requires additional cooling to except cooling by the low temperature radiator 30.

A turbocharger 130 is provided to the engine 12, and a water-cooled intercooler 132 for cooling air passing through the turbocharger 130 is disposed at the second coolant line 82 such that coolant passing through the condenser 60 cools the intercooler 132.

On the coolant line 80, a pump 150 is disposed so as to circulate coolant and a one-way valve 160 provided so as to prevent backflow of coolant.

The side duct 50 includes a front duct 52 bent by a curved line such that air flowed into the vehicle is guided toward inside in a width direction of the vehicle and a rear duct 54 bent toward outside in a width direction of the vehicle the vehicle by a curved line such that air passed the front duct 52 flows toward a wheel of the vehicle. In addition, cooling efficiency of the first ancillary radiator 32 and second ancillary radiator 34 can be improved as the front duct 52 and the rear duct 54 are bent with an "S" shape such that air flowing via the first ancillary radiator 32 or second ancillary radiator 34 is not partially flowed.

Air curtain may be formed in front of a wheel as a guide airfoil 56 is disposed at the rear duct 54 so as to guide air toward a wheel of the vehicle. Therefore, cooling of brake pad and aerodynamic characteristics can be improved.

The cooling and thermoelectric power generating system for a vehicle according to various embodiments of the present invention can improve cooling performance of a vehicle and generate electric power required for a vehicle by using waste heat.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A cooling and thermoelectric power generating system for a vehicle comprising:
    a low temperature radiator disposed at an ambient air intake which is configured to allow ambient air in front of the vehicle to be introduced to an engine room;
    a coolant line adapted that coolant passing through the low temperature radiator is circulated again through the low temperature radiator via a water-cooled condenser;
    a refrigerant line adapted that refrigerant is flowed through the condenser;
    a thermoelectric generator adapted that coolant flowing through the coolant line and refrigerant flowing through the refrigerant line are passed therethrough,
    wherein the thermoelectric generator performs thermoelectric generation by using temperature difference between coolant flowing through the coolant line and refrigerant flowing through the refrigerant line;
    at least a pair of side ducts symmetrically formed to guide ambient air in front of the vehicle toward a wheel of the vehicle, wherein an ancillary low temperature radiator is disposed at each side duct for selectively cooling coolant passing through the low temperature radiator; and
    the coolant line comprising:
        a first coolant line adapted that coolant passing through the low temperature radiator is flowed to the condenser;
        a second coolant line adapted to transmit coolant exhausted from the condenser to the thermoelectric generator;
        a third coolant line adapted to transmit coolant passing through the thermoelectric generator to the low temperature radiator;
        a fourth coolant line branched from the first coolant line so as to be connected with one of the ancillary low temperature radiators and connected again with the first coolant line; and
        a fifth coolant line branched from the third coolant line so as to be connected with the other one of the ancillary low temperature radiators and connected again with the third coolant line,
    wherein a first control valve is disposed at a portion that the first coolant line and the fourth coolant line are branched to each other for controlling such that coolant flowing through the first coolant line is selectively flowed through the fourth coolant line, and a second control valve is disposed at a portion that the third coolant line and the fifth coolant line are branched to each other for controlling such that coolant flowing through the third coolant line is selectively flowed through the fifth coolant line.

2. The system of claim 1, wherein a turbocharger is provided to the engine and a water-cooled intercooler is disposed at the second coolant line to cool air passing through the turbocharger such that coolant passing through the condenser cools the intercooler.

3. The system of claim 1, the side duct comprising:
    a front duct bent by a curved line such that air flowed into the vehicle is guided toward inside in a width direction of the vehicle; and
    a rear duct bent toward outside in a width direction of the vehicle by a curved line such that air passed through the front duct flows toward a wheel of the vehicle.

4. The system of claim 3, wherein a guide airfoil is disposed at the rear duct so as to guide air toward a wheel of the vehicle direction.

5. The system of claim 1, wherein a pump is disposed on the coolant line.

6. The system of claim 5, wherein a one-way valve is provided to the coolant line for preventing backflow of coolant.

7. The system of claim 3, wherein the front duct and the rear duct are bent with an "S" shape such that air flowing via the ancillary low temperature radiators is not partially flowed.

* * * * *